United States Patent [19]
Uenoyama et al.

[11] Patent Number: 5,551,586
[45] Date of Patent: Sep. 3, 1996

[54] METHOD FOR MANUFACTURING AN ELECTROMAGNETIC CONVERSION DEVICE AND A DISPLACEMENT DETECTOR WHICH USES AN ELECTROMAGNETIC CONVERSION DEVICE

[75] Inventors: Hirofumi Uenoyama, Anjo; Kenichi Ao, Tokai; Yasutoshi Suzuki, Okazaki; Yoshimi Yoshino, Inuyama; Motofumi Suzuki, Aichi-gun, all of Japan

[73] Assignee: Nippondenso Co., Ltd., Kariya, Japan

[21] Appl. No.: 293,966

[22] Filed: Aug. 24, 1994

[30] Foreign Application Priority Data

Aug. 25, 1993 [JP] Japan ................................ 5-210634

[51] Int. Cl.⁶ .................. B44C 1/22; C23F 1/00; H01L 21/00
[52] U.S. Cl. ..................... 216/22; 216/41; 156/656.1; 156/657.1; 437/245; 437/246; 257/427
[58] Field of Search ............................ 216/22, 41, 75, 216/78, 79, 100, 101, 105; 156/657.1, 656.1; 437/245, 246; 257/427, 428

*Primary Examiner*—William Powell
*Attorney, Agent, or Firm*—Cushman, Darby & Cushman

[57] ABSTRACT

A method of manufacturing a magneto-electric conversion device having a large rate of change of magnetic resistance and which is easy to position with respect to a magnetized surface, and a moving subject displacement detector using a magneto-electric conversion device manufactured by that method. A magnet which rotates together with the rotation of a drive gear is magnetized in alternately differing north and south poles, arranged in an equal sized section from a center portion thereof. An IC chip is positioned opposite to and at a distance from the magnetized surface of the magnet. Magneto-electric conversion devices are located on the IC chip. These magneto-electric conversion devices are formed by repeated alternate depositions, onto a surface of a single-crystal silicon substrate, of magnetic cobalt films having a thickness of several to several tens of angstroms and non-magnetic copper films having a thickness of several to several tens of angstroms.

14 Claims, 11 Drawing Sheets

METHOD FOR MANUFACTURING AN ELECTROMAGNETIC CONVERSION DEVICE AND A DISPLACEMENT DETECTOR WHICH USES AN ELECTROMAGNETIC CONVERSION DEVICE

BACKGROUND OF THE INVENTION

1. Field of the Invention

The present invention relates to a method for manufacturing a magneto-electric conversion element which uses magnetism to detect the displacement of a moving object, and also to a displacement detector which uses a magneto-electric conversion device manufactured by that method that detects the displacement of a moving object.

2. Description of the Related Art

In the past, vehicle speed sensors, as shown in FIG. 14, included ferromagnetic magnetoresistive elements 31 formed by a thin film layer, such as Ni—Co or Ni—Fe, and an IC chip 32 onto which the ferromagnetic magnetoresistive elements 31 and a signal processing circuit of, for example, a bipolar transistor were provided. The IC chip 32 is located opposite a multipole magnet 33 which rotates along with the rotation of a drive gear. When the multipole magnet 33 rotates along with the drive gear, the change in magnetic flux detected by the ferromagnetic magnetoresistive element 31 is used to detect the rotation of the device gear.

However, the change in magnetic resistance of an Ni—Co or Ni—Fe element is 2 to 5%. As a result, when four ferromagnetic magneto-electric conversion devices are used to configure a bridge circuit, the S/N ratio of the intermediate voltage difference generated (offset voltage) drops. Also the thin film shown in FIG. 14 exhibits angle dependency with respect to magnetic flux A (horizontal vector magnetic flux). In order to obtain the maximum rate of change, it is necessary to determine the positioning of the multipole magnet 33 and IC chip 32 with high precision, thereby presenting a problem of high manufacturing cost.

To solve this problem, an object of the present invention is to provide a method of manufacturing a magneto-electric conversion device that not only has a high rate of change of magnetic resistance, but also provides easy alignment of the magneto-electric conversion device with respect to a magnetized surface and, in addition, to provide a moving object displacement detector formed using a magneto-electric conversion device manufactured by this method.

SUMMARY OF THE INVENTION

The above-noted object of the present invention is achieved by making use of the following technical constitution. Specifically, with regard to the manufacture of a magneto-electric conversion device which converts a change in a magnetic quantity to a change in an electrical quantity, the present invention provides a method of manufacturing a magneto-electric conversion device which basically comprises a step of alternately depositing a magnetic thin film and a non-magnetic thin film on a substrate, a step in which an insulating film is deposited over the above-noted thin films, and a step in which the above-noted layer which has an insulating film layer is patterned.

Further, a moving object displacement detector which uses a magneto-electric conversion device manufactured by the above-noted method is basically configured so that, with respect to a moving object which has surfaces which are magnetized alternately with differing magnetic poles, the magneto-electric conversion device is positioned so as to be opposite from and at the required distance from this moving object.

It is also possible for the above-noted moving object to be a rotating body.

The above-noted layer of magnetic and non-magnetic thin films at the magnetoresistive elements can be patterned after being covered with an insulating film.

In a moving object displacement detector which uses the magneto-electric conversion device of the above-noted invention, when the moving object is displaced, the change in magnetic flux from the magnetized surfaces is converted to a change in resistance by the magnetoresistive elements and output as an electrical signal. In doing this, by using alternating magnetic and non-magnetic thin film layers as the magnetoresistive elements, the rate of change of the magnetic resistance becomes large. When positioning the magnetoresistive elements with respect to the magnetized surface, the use of alternating magnetic and nonmagnetic thin film layers as the magnetoresistive elements, provides no in-plane angle dependency. As a result, it is easy to position the magnetoresistive elements with respect to the magnetized surface.

If a rotating body is used as the moving object, it is possible to detect information such as the rotational speed of the rotating body as a change in magnetic flux.

In addition, the above-noted laminate of magnetic and non-magnetic thin film layers in the magnetoresistive elements is patterned after it is covered with an insulating film. As a result, because the surface of the layer is not subjected to a high-temperature atmosphere during the photoprocessing for the purpose of patterning, surface oxidation of the layer is prevented. In addition, the layer does not come into contact with resist peeling liquid during patterning, thereby preventing a change in properties of the surface of the layer.

DESCRIPTION OF THE PREFERRED EMBODIMENTS

Embodiments of a method of manufacturing a magneto-electric conversion device of the present invention and embodiments of the moving object displacement detector which uses the magneto-electric conversion device will be described in detail below with reference to the drawings.

As shown in FIG. 4 to FIG. 7, the method of manufacturing a magneto-electric conversion device that converts changes in magnetic quantities to changes in electrical quantities includes, for example, a step in which an insulating film is provided over the above-noted thin magnetic and non-magnetic film layers, and a step in which the above noted layer which has an insulating film is patterned.

In addition, in the method of manufacturing the magneto-electric conversion device having the above-noted basic configuration, it is also possible to include a step of forming a surface-protection film on the above-noted layer having an insulating film and patterned as noted above.

Furthermore, it is also possible to use a magnetoresistive element as the above-noted magneto-electric conversion device of the present invention.

The following is an explanation of the basic configuration of the magneto-electric conversion device obtained by the magneto-electric conversion device manufacturing method of the present invention, and an explanation of the basic configuration of a moving object displacement detector which uses this magneto-electric conversion device.

Figure 1:
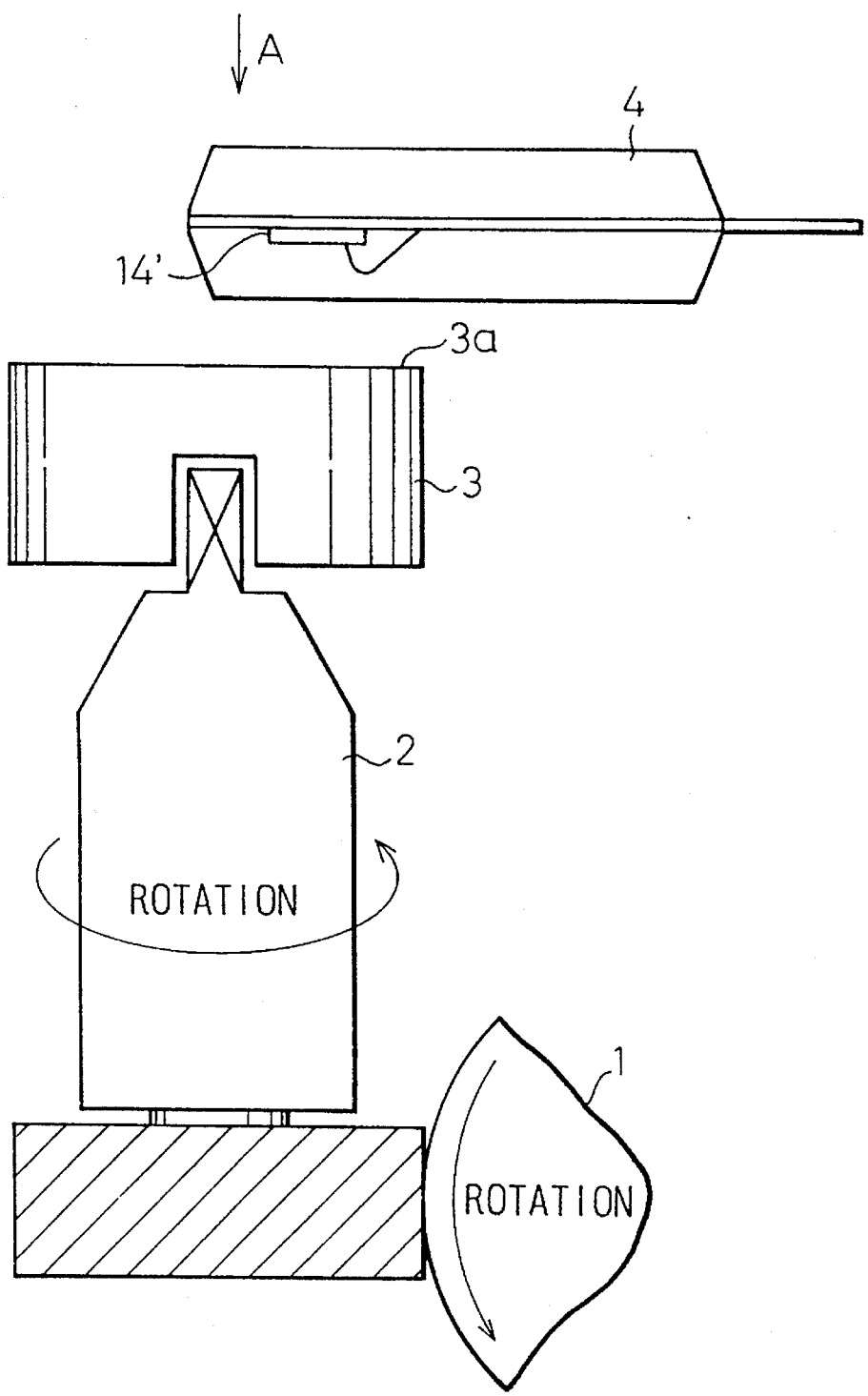
FIG. 1 illustrates the overall configuration of the rotation detector in the 1st embodiment of a vehicle speed sensor.

FIG. 1 is a simplified diagram of an embodiment of a moving object displacement detector which is used in the present invention. Basically, what is shown is a moving object displacement detector which has a moving object 3, having a magnetized surface 3a alternately magnetized with different magnetic poles, and a magneto-electric conversion device 5, see FIG. 2, which is located a predetermined distance from the above-noted magnetized surface 3a and disposed so as to oppose surface 3a. Magneto-electric conversion device includes repeated alternate layers of magnetic and non-magnetic thin films.

Figure 2:
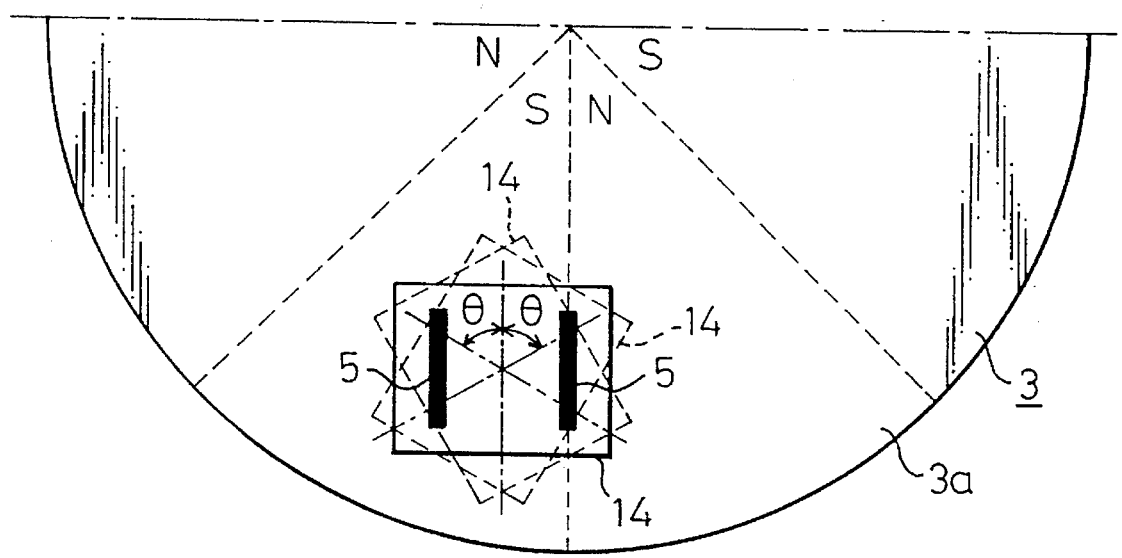
FIG. 2 is a plan view of the device illustrated in FIG. 1.

FIG. 1 shows the application of a rotation detector, which is one embodiment of the moving object displacement detector of the present invention, to a vehicle seed sensor. FIG. 2 shows the top view of FIG. 1 (from the direction indicated by the arrow A in FIG. 1).

When the drive gear within the transmission meshes with the driven gear 2, the rotation of the drive gear 1 is transmitted to the driven gear 2. This driven gear 2 is provided with a magnet 3, which rotates With the driven gear 2. As shown in FIG. 2, the top surface of the magnet 3 is divided into equal sections magnetized alternately as north and south poles, so that magnet 3 forms a multipole magnet. Above the top surface of the magnet 3 (magnetized surface 3a), is located an IC chip 14, which is the chip implementation of above-noted magneto-electric conversion device, which is formed by alternate dispositions of magnetic and non-magnetic thin films. IC chip 14 is located opposite the magnet 3 at a small distance from it.

IC chip 14 is molded, and is further resin molded into IC 4. IC chip 14 contains magneto-electric conversion devices 5, with north and south poles of magnet 3 being detected by the magneto-electric conversion devices 5 so that, as described above, the rotation of drive gear 1 (vehicle speed) is detected.

Figure 3:
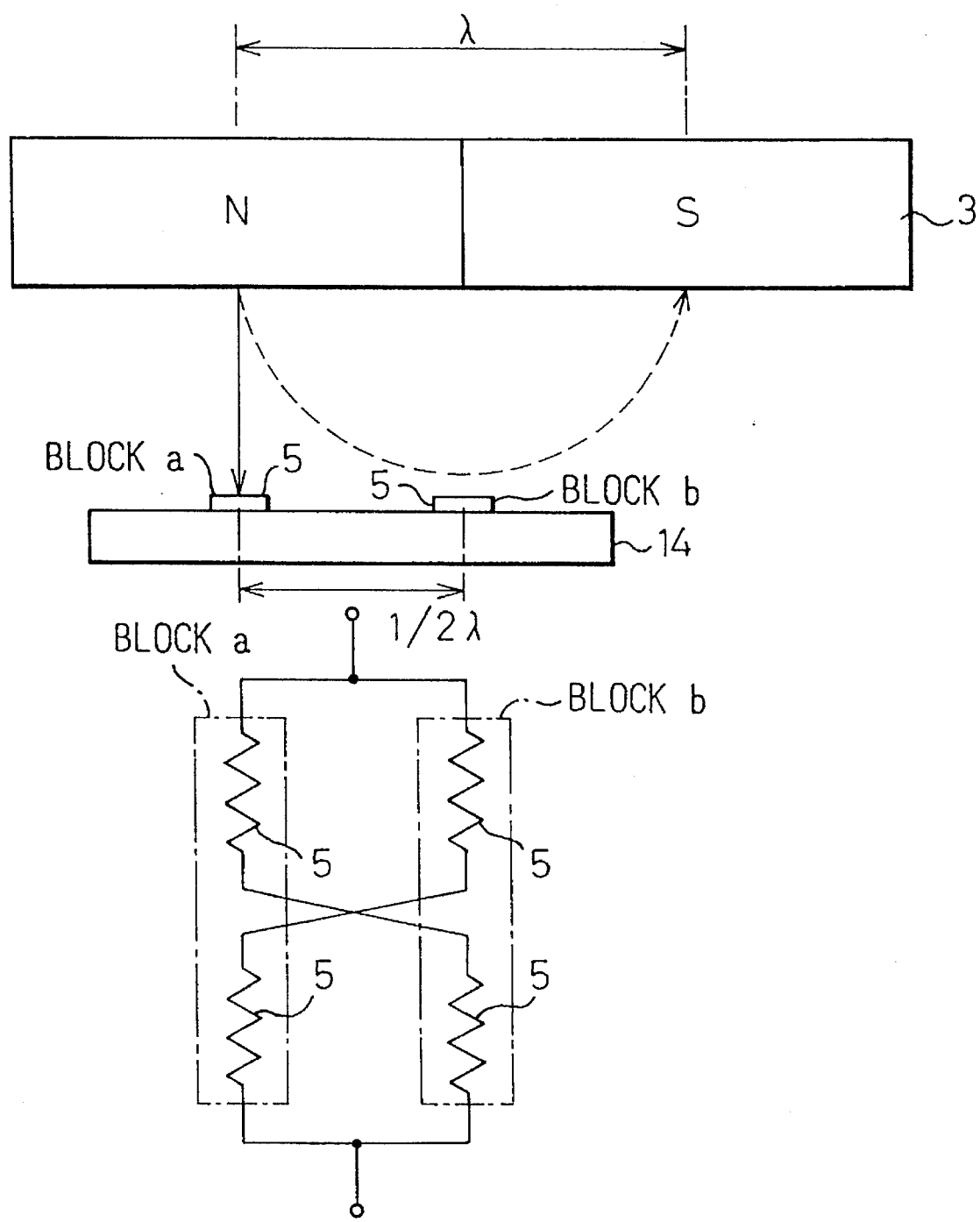
FIG. 3 is a drawing which explains the operation of a rotation detector.

Next, the relationship between the magnetization pitch of magnet 3 and the pattern pitch of the magneto-electric conversion devices 5 will be explained with reference to FIG. 3.

First, the magneto-electric conversion devices 5 are located inside IC chip 14. FIG. 3 illustrates four magneto-electric conversion devices 5 forming a bridge circuit. That is, there are two magneto-electric conversion devices 5' located in block a on the left side of FIG. 3 and two magneto-electric conversion devices 5 located in block b on the right side of FIG. 3, these being cross-connected to form a bridge. The positioning of devices 5 and 5' is such that when the magnetic flux from a north pole of magnet 3 flows into a south pole, a vertical magnetic flux is applied to the magneto-electric conversion device 5 of block a, and a horizontal magnetic flux is applied to the magneto-electric conversion device 5' of block b. In addition, the ideal pitch of the block a magneto-electric conversion device 5 and the block b magneto-electric conversion device 5' is $\frac{1}{2}\lambda$, with respect to the pitch $\lambda$ of the north and south poles of magnet 3. Furthermore, the same kind of output is obtained even if the block a magneto-electric conversion device 5 and block b magneto-electric conversion device 5' pitches are in the region of $\frac{1}{2}\lambda$.

Next, the magneto-electric conversion devices 5 which make up IC chip 14 and the method for their manufacture will be described in detail with reference to FIG. 4 to FIG. 7.

Figure 4:
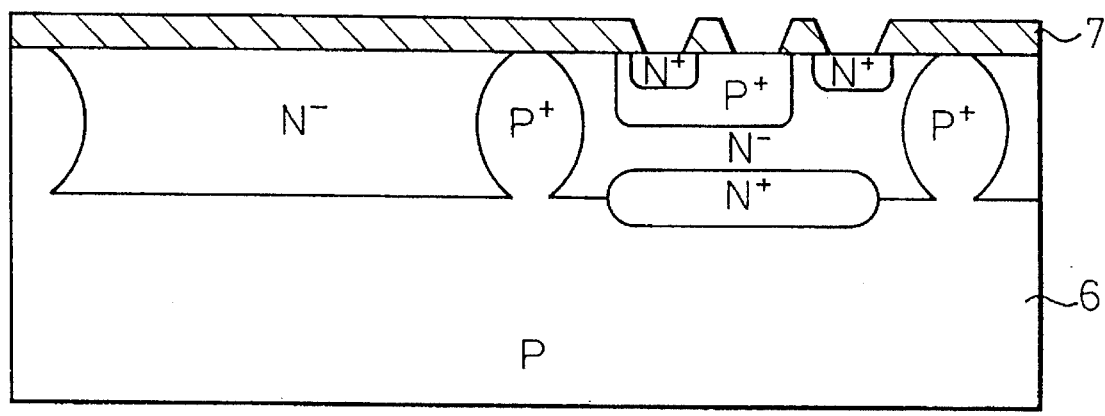
FIG. 4 illustrates a manufacturing process for a rotation detector.
Figure 5:
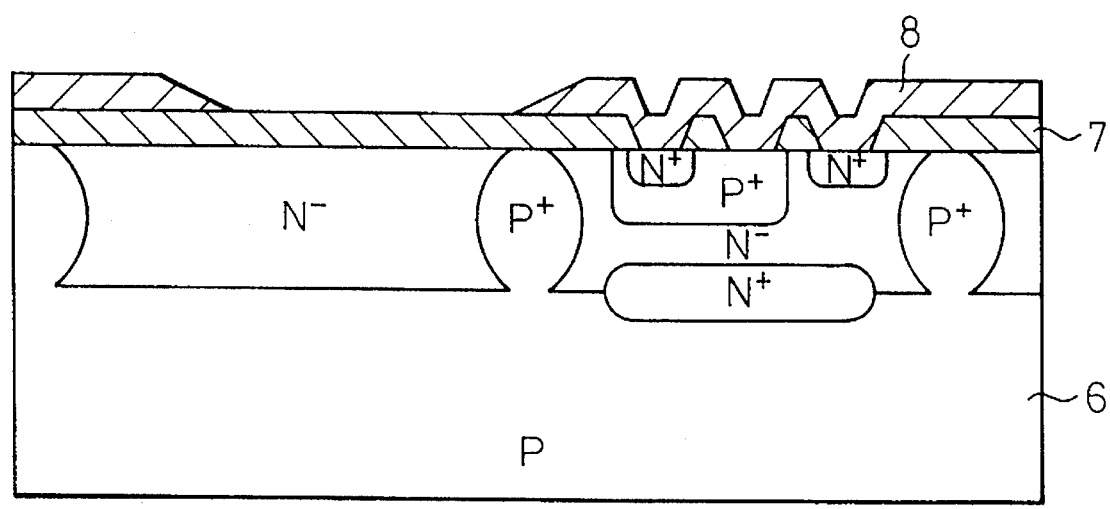
FIG. 5 also illustrates a manufacturing process for a rotation detector.

As shown in FIG. 4, a bipolar transistor is formed as a signal processing circuit on a single-crystal silicon substrate 6, and an insulating film 7 is formed on the top surface of the single-crystal silicon substrate 6. In addition, as shown in FIG. 5, an aluminum or other wiring material 8 is formed over the insulating film 7.

Figure 6:
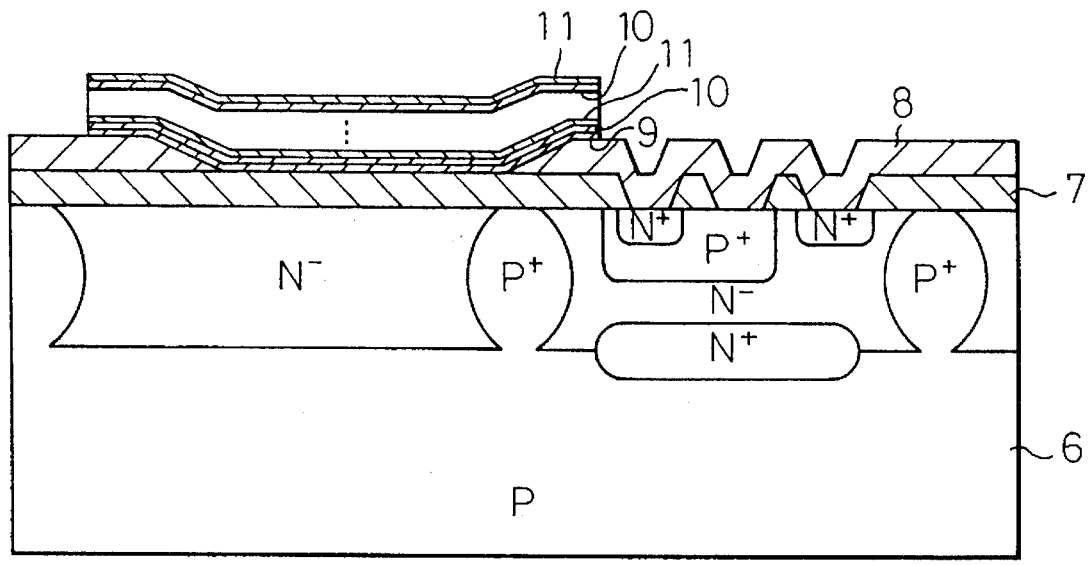
FIG. 6 illustrates a manufacturing process for a rotation detector.

In addition, as shown in FIG. 6, on the top surface of the single-crystal silicon substrate 6, a soft-magnetic material made of Ni—Fe is formed as a buffer film 9, having a thickness of several angstroms to several tens of angstroms. Further, on top of film 9 is provided a non-magnetic copper film 10 of several to several tens of angstroms. A cobalt film 11 of several to several tens of angstroms is formed, on film 10. The formation of non-magnetic copper film 10 and cobalt film 11 is repeated so that n layers are made in a vacuum of for example, $10^{-2}$ Torr.

The number of layers n of the copper film 10 and the cobalt film 11 corresponds to the number that maximizes the magneto-electric conversion effect. With regard to the buffer film 9, the copper film 10, and the cobalt film 11, values are chosen from the relationship of the saturation magnetic field and rate of change of magnetic resistance.

After that, the required patterns are applied to the layer of the copper film 10 and the cobalt film 11. The layer of the copper film 10 and the cobalt film 11 forms the above-noted magneto-electric conversion device 5.

Figure 7:
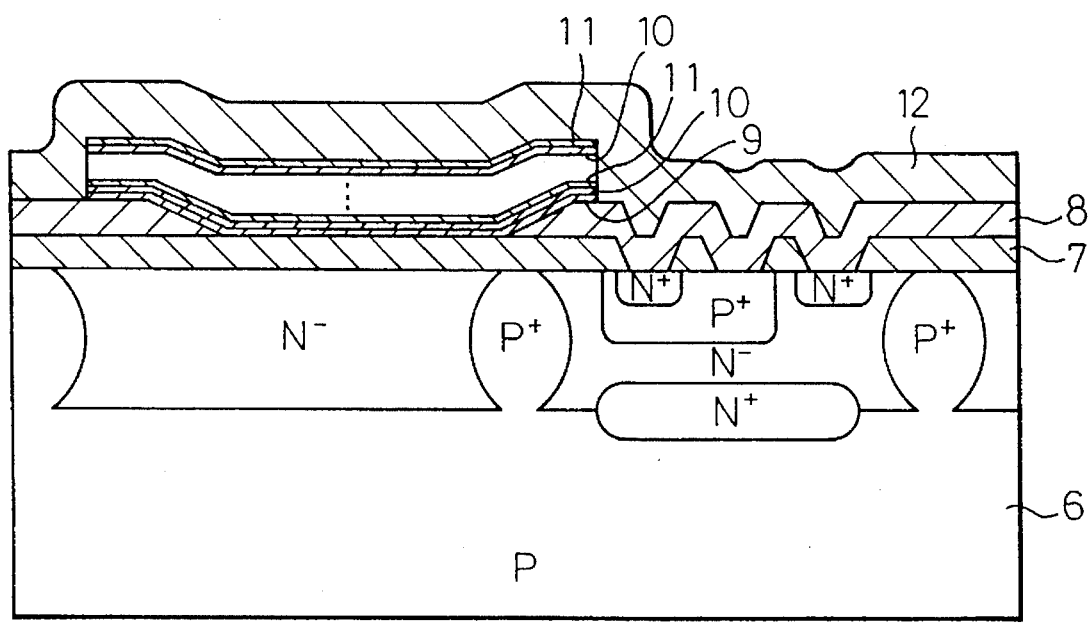
FIG. 7 illustrates a manufacturing process for a rotation detector.

As shown in FIG. 7, a surface-protection film 12 of silicon nitride is formed on the top surface of the single crystal silicon substrate 6 using a plasma CVD system. In addition, only the locations of this surface-protection film 12 for terminals are etched to form openings. This surface protection film 12 protects the deposition of copper film 10 and cobalt film 11, and the signal processing circuit elements (bipolar transistor) formed in the surface of the single crystal silicon substrate from the outside atmosphere.

Next, the IC chip which uses the laminate (magneto-electric conversion device) of the thus manufactured copper film 10 and cobalt film 11 is molded, using prior art sealing technology. The result is the molded IC 4 of FIG. 1.

In FIG. 2, although the IC chip 14 is ideally positioned with no inclination with respect to the upper surface of magnet 3 (magnetized surface 3a), inclination caused during assembly is unavoidable. Because in this embodiment the magnetic thin film (cobalt film 11) and non-magnetic thin film (copper film) are alternately repeated, the magneto-electric conversion device 5 does not have an in-plane angle dependency. Therefore, the angle of assembly of the IC chip 14 with respect to the magnetized surface 3a of the magnet 3 is allowed to be in the range q=±60°.

Figure 8:
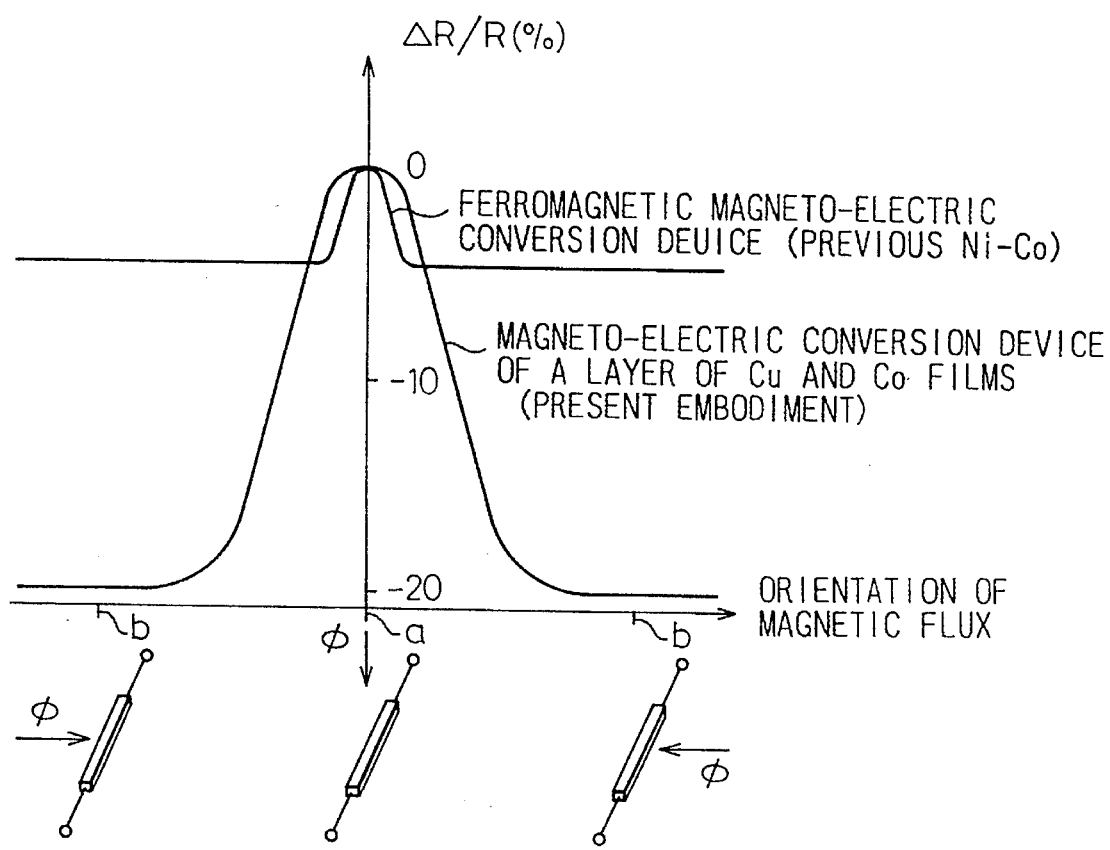
FIG. 8 is a graph which shows the rate of change of magnetic resistance.

In FIG. 8 is shown a graph of the magnetic resistance rate of change for the magneto-electric conversion device 5 of this embodiment and that of a previous ferromagnetic (Ni—Co) magneto-electric conversion device. In the case of this graph, in the magneto-electric conversion device 5 of this embodiment, the thickness of the copper film 10 is 20 Å, the thickness of the cobalt film 11 is 10 Å, deposition was done 16 times, and the thickness of the film 9 (Ni—Fe) is 50 Å.

In FIG. 8, in the case in which magnetic flux is applied to the element in a horizontal direction (shown as b in the drawing), the resistance of the previous ferromagnetic magnetoresistive element of, for example, Ni—Co decreases only approximately 2 to 5%. In the case of the magneto-electric conversion device 5 of this embodiment, the decrease in resistance is approximately 20%. If, on the other hand, magnetic flux is applied to the element in a perpendicular direction (shown as a in the drawing), neither of the elements shows a change in resistance.

Figure 9:
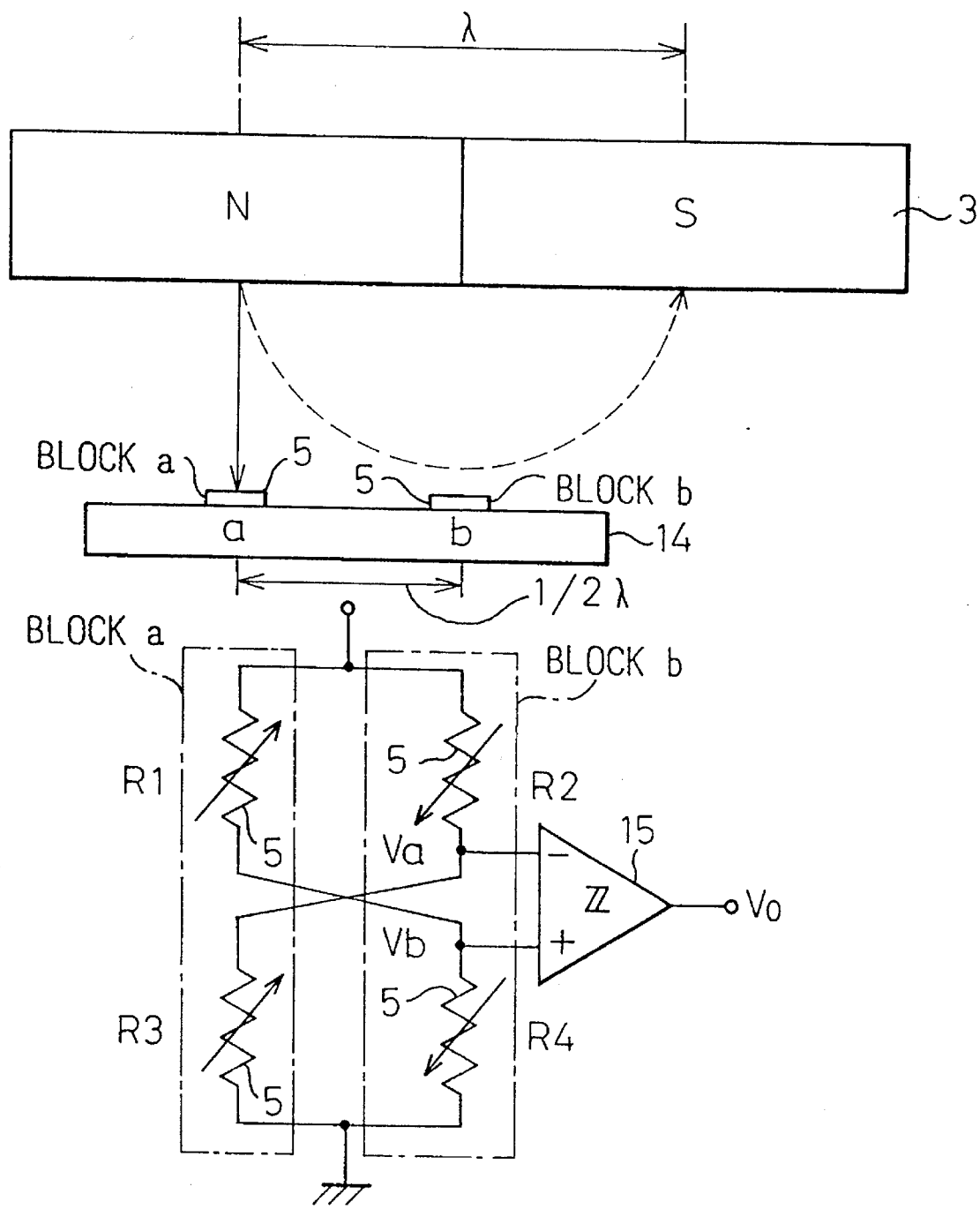
FIG. 9 is a drawing which explains the operation of a rotation detector.
Figure 10:
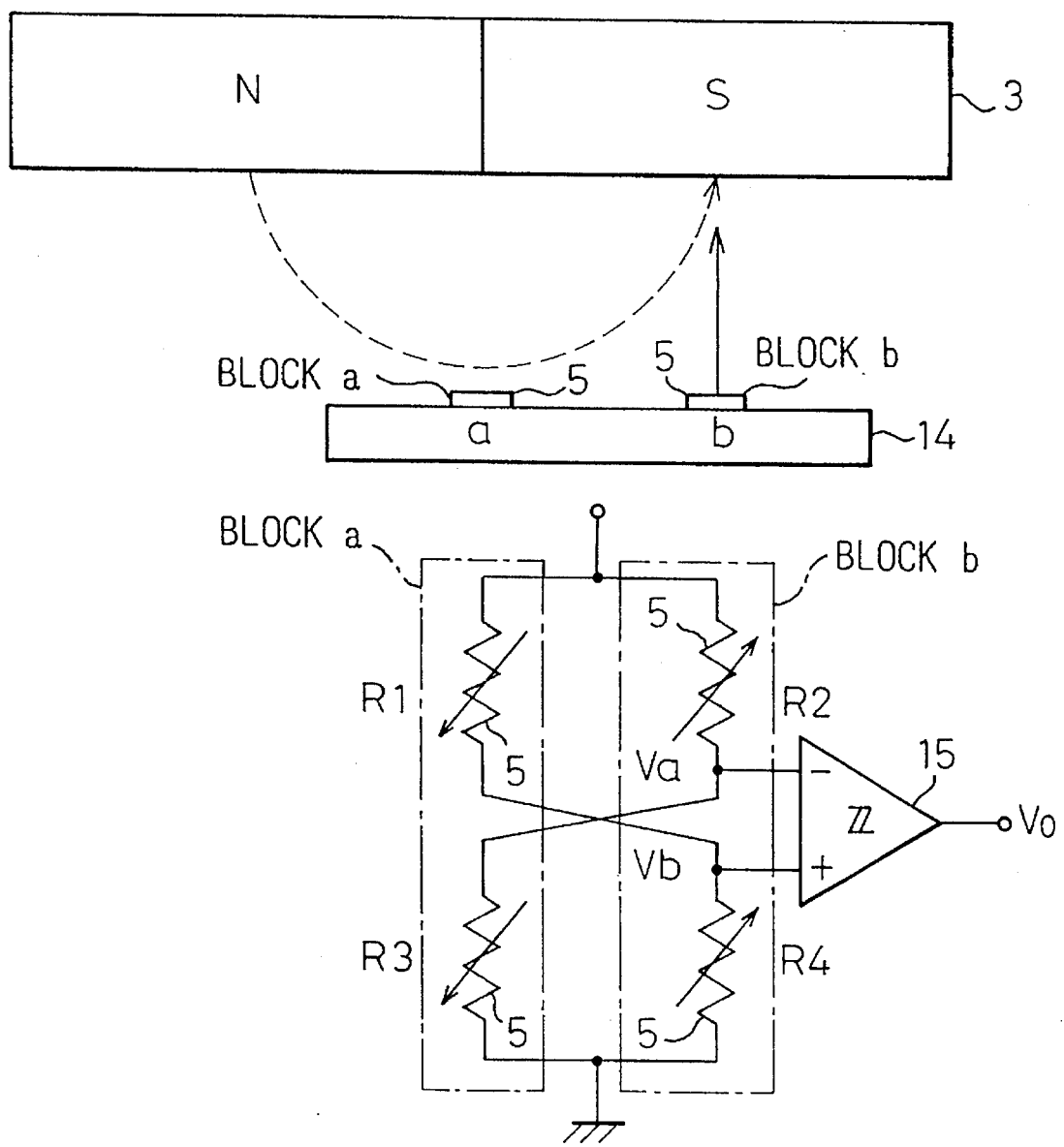
FIG. 10 is a drawing which explains the operation of a rotation detector.

FIG. 9 and 10 will be used to explain the operation when characteristics such as these are applied to a vehicle speed sensor.

Figures 9, 10, 11:
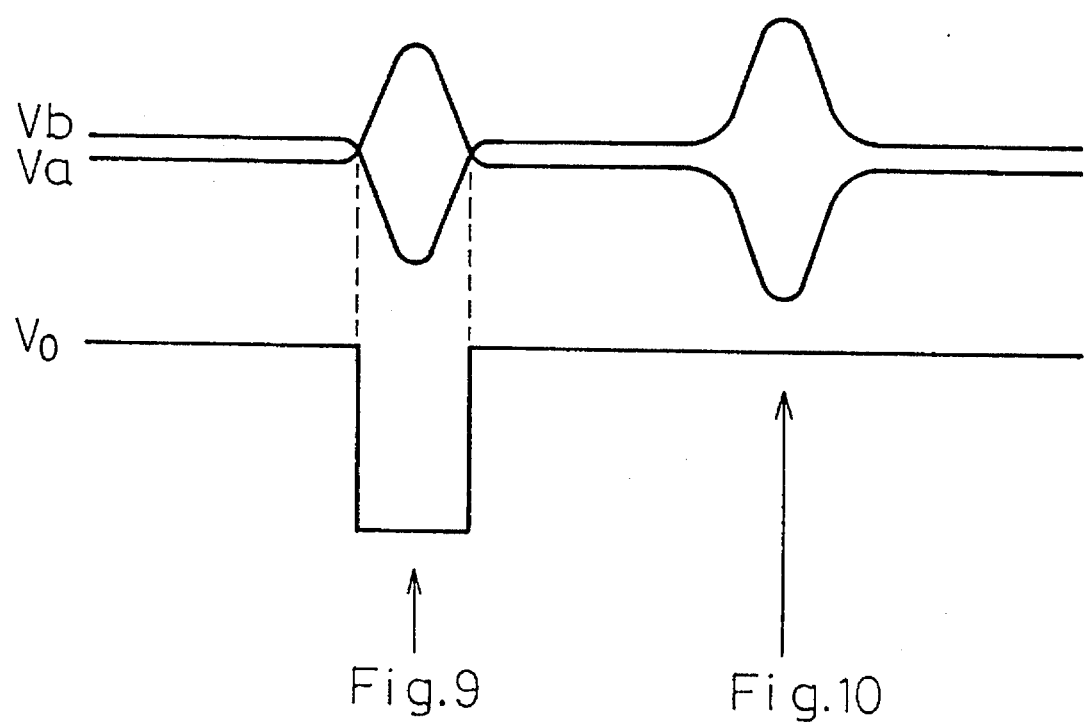
FIG. 11 is a waveform diagram for explaining the rotation detector according to a 2nd embodiment of the present invention.

If, with respect to the magnet 3 magnetization pitch A, the pattern pitch of the magneto-electric conversion device 5 is set to ½ Å, the magnetic flux from the north pole is applied vertically with respect to the block a magneto-electric conversion device 5, that is, to resistance R1 and resistance R3. When this is the case, the resistance value of the magneto-electric conversion device 5 of block a does not change. With respect to the block b magneto-electric conversion device 5, that is, with respect to the resistance R2 and the resistance R4, the magnetic flux is applied horizontally, so that the resistance of the magneto-electric conversion device of block b decreases by 20%. If we look at the center point voltage va of the bridge, as shown in FIG. 11, because R3 is larger and R2 is smaller, the center point voltage va becomes maximum. Because R4 is smaller and R2 is larger, the center point voltage Vb of FIG. 9 becomes a minimum.

Next, if magnet 3 rotates into the position shown in FIG. 10, horizontal magnetic flux is applied to the magneto-electric conversion device 5 of block a and vertical flux is applied to the magneto-electric conversion device 5 of block b, the changes in resistance being the reverse of those describe above, resulting in the waveforms shown in FIG. 11.

As shown in FIG. 9 and FIG. 11, these center point voltages Va and Vb are input to a comparator for waveform processing and output as rectangular waveforms. In FIG. 11, the output of comparator 15 is V0.

A voltage difference (offset voltage) is generated between the center voltages Va and Vb of the full bridge circuit formed by resistance R1 to R4 of magneto-electric conversion devices 5 of this embodiment, and because the rate of change of resistance of 20% is approximately 4 times that of the previously used Ni—Co or other material, the S/N is also approximately 4 times greater, resulting in stable operation.

In an embodiment such as this, the magneto-electric conversion devices 5 are formed by alternately repeating the deposition of a cobalt film 11 (magnetic thin film) and a copper film 10 (non-magnetic thin film). Therefore, when the magnet 3 (rotating body) rotates, the change in magnetic flux from the magnetized surface 3a is converted to a resistance value by the magneto-electric conversion devices 5 and output as an electrical signal. In doing this, by using the magneto electric conversion devices 5, the rate of change or magnetic resistance becomes large. When positioning the magneto-electric conversion devices with respect to the magnetized surface 3, because magneto-electric conversion devices 5 do not have in-plane angle dependency, it is easy to position the magneto-electric conversion devices 5 with respect to the magnetized surface 3a.

Also, because there is a buffer film 9 below the deposition of copper films 10 and cobalt films 11, it is possible to improve the characteristics of the magneto-electric conversion devices 5.

As is clear from the above-described embodiment, in the method of manufacturing a magneto-electric conversion device of the present invention, it is also possible to make the above-noted substrate 6 from a single-crystal silicon wherein an insulating film 7 is formed at the surface of the substrate. In the method of manufacturing a magneto-electric conversion device of the present invention, it is also desirable to have a step in which a buffer film 9, over the surface of the above noted substrate 6 is formed before hand.

It is possible to make the above-noted buffer film, which is used in the method of manufacturing a magneto-electric conversion device of this embodiment, from a soft-magnetic material such as Ni—Fe.

In the present invention it is desirable to have a step in which a magnetic thin film 11 and a non-magnetic thin film 10 are alternately deposited onto the above-noted substrate 6 used in the present invention. More specifically it is desirable to alternately deposit the above-noted magnetic thin film 11 and the non-magnetic thin-film 10 a number of times.

It is desirable that the magnetic thin film 11 used in the present invention be a cobalt film and that the nonmagnetic thin film 10 used in the present invention be a copper film.

Next, another embodiment of the method of manufacturing a magneto-electric conversion device of the present invention will be described with reference to FIG. 12 and 13.

The explanation will be presented chiefly in terms of the difference is between the 2nd embodiment and the 1st embodiment.

Figure 12:
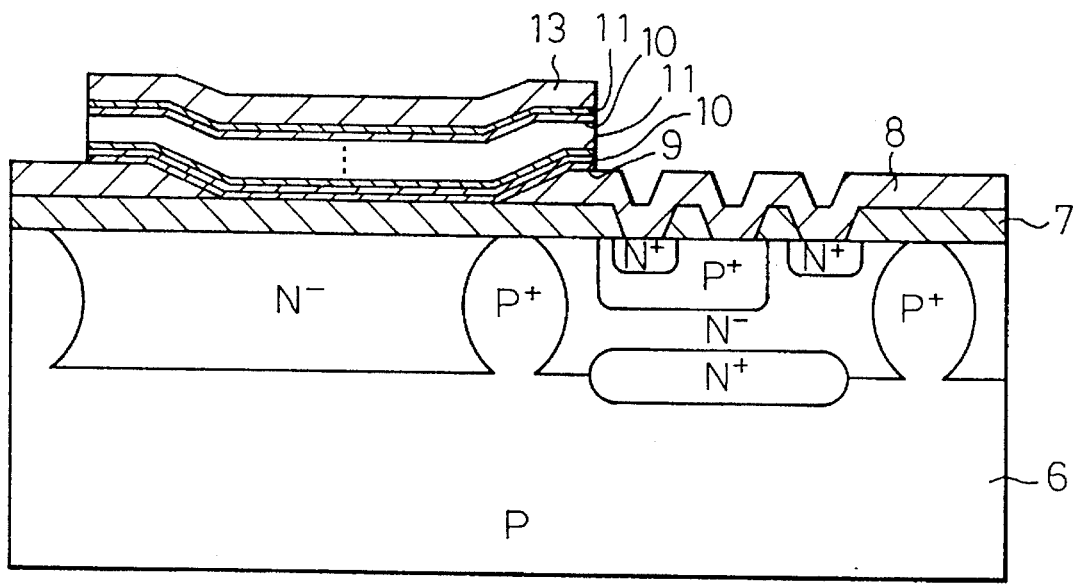
FIG. 12 illustrates a manufacturing process for the rotation detector of the 2nd embodiment.
Figure 13:
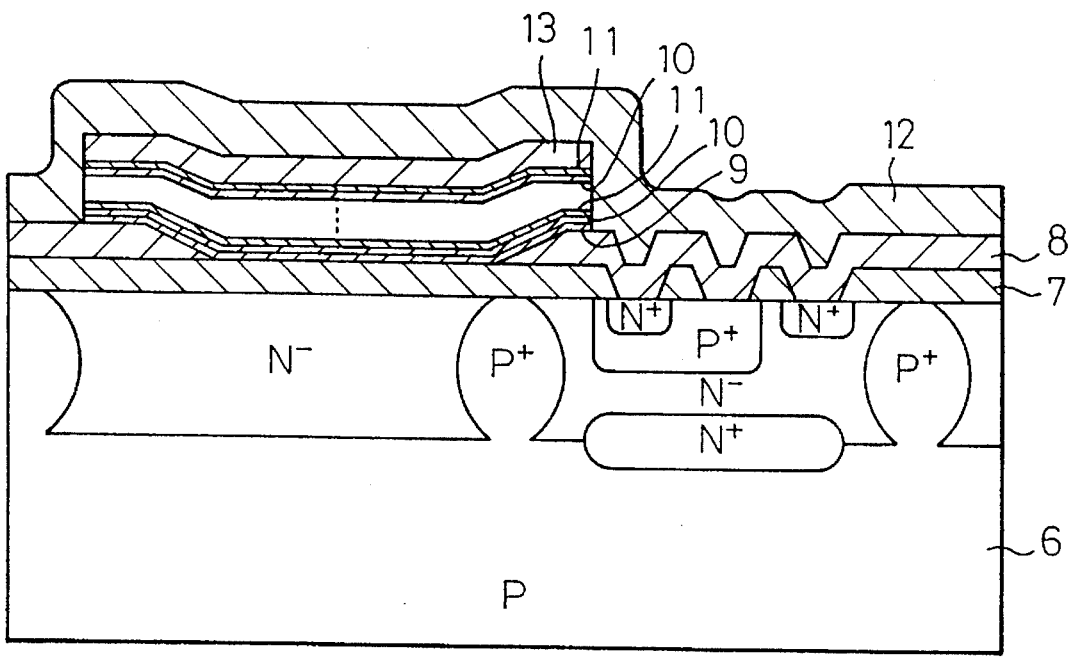
FIG. 13 also illustrates a manufacturing process for the rotation detector of the 2nd embodiment.
Figure 14:
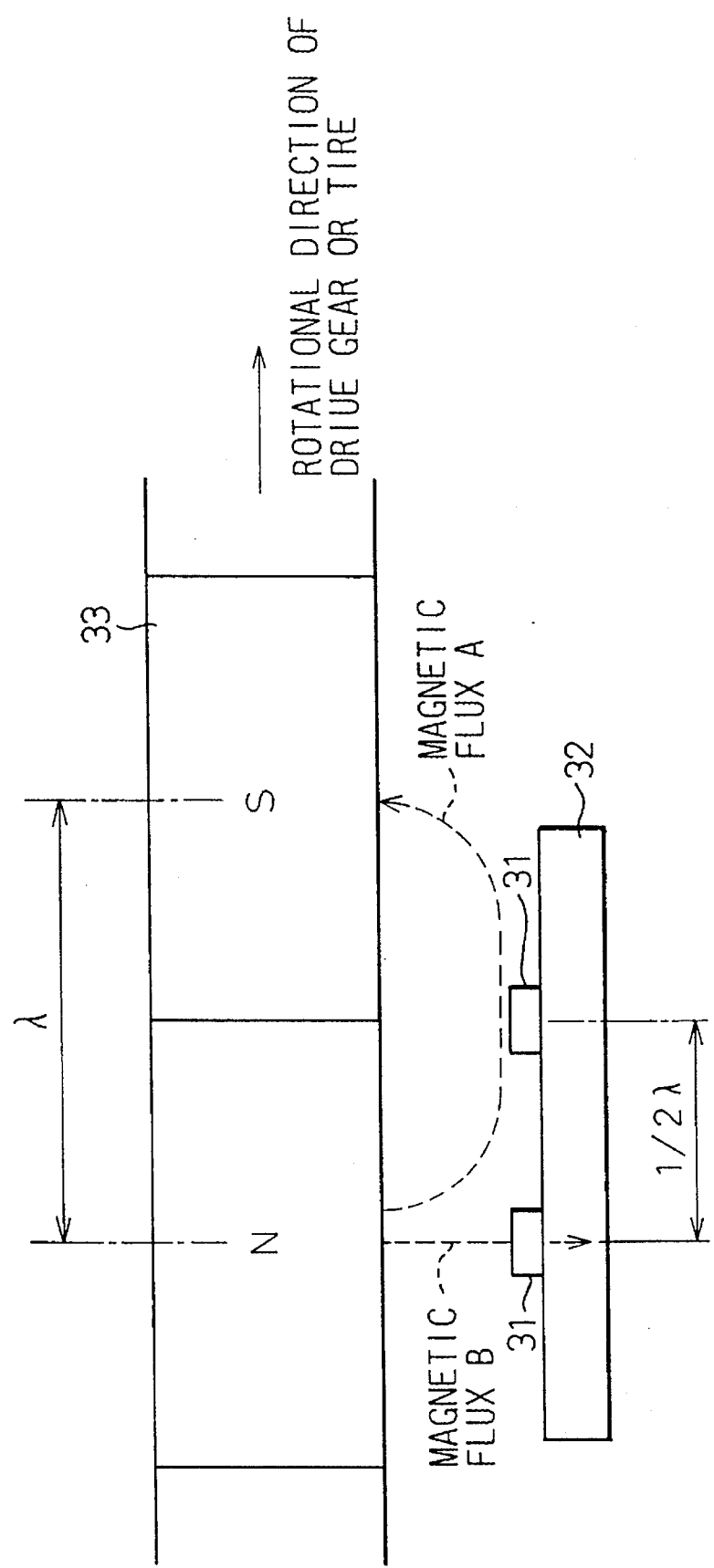
FIG. 14 is a drawing which explains a conventional rotation detector.

In this 2nd embodiment as shown in FIG. 12, an insulating film 13 is located on the upper surface of the layer of copper films 10 and cobalt films 11.

The method of manufacture is described below.

Starting from the condition of the 1st embodiment shown in FIG. 5, as shown in FIG. 12, a buffer film 9 made of Ni—Fe soft-magnetic material having a thickness of several to several tens of angstroms is formed on the upper surface of the single crystal silicon substrate 6. See FIG. 12. Over film 9 is formed a non-magnetic copper film 10 of a thickness of several to several tens of angstroms, and over that is formed a magnetic cobalt film 11 of a thickness of several to several tens of angstroms. Then the lamination of magnetic cobalt films 11 and non-magnetic copper films 10 is repeated alternately n times in a vacuum (of for example at $10^{-2}$ Torr).

After that, immediately after forming the layer or copper films 10 and cobalt films 11, an insulating film of $SiO_2$ is formed while maintaining the vacuum as high as possible by means of the sputtering or the CVD method. Then the required patterning is performed simultaneously on the layer of copper films 10, cobalt films 11 and the insulating film 13 using photoprocessing. After that, as shown in FIG. 13, a surface-protection film of silicon nitride is formed.

In this manner, patterning is performed after applying a surface-protection film 13 over the layer of the cobalt films 11 (magnetic thin films) and copper films 10 (non-magnetic thin films) of the magneto-electric conversion device 5. Because the surface of the layer is not subjected to a high-temperature oxygen atmosphere at the photoprocessing stage, it is possible to prevent oxidation of the surface. Also, because the layer does not come into contact with resist peeling liquid during patterning, it is possible to prevent a change in properties of the surface of the layer. Because the positioning of this type of insulating film 13 prevents oxidation and a change in the surface properties of the layer, not only is it possible to reduce the change in specific resistivity to $1/10$ to $1/100$ at the patterning step, but it is also possible to prevent a decrease in the rate of change of resistance.

The present invention is not limited to the above embodiments. For example, although in the above-noted embodiments the magneto-electric conversion devices 5 which form the sensing section and the bipolar IC which is the signal processing circuit are implemented on a single chip, it is also possible to integrate these as MOSFET devices such as CMOS or Bi-MOS. In addition, it is also possible to provide two chips: a sensing chip which uses the magneto-electric conversion devices 5 formed as a layer of copper films 10 and cobalt films 11; and a signal processing circuit chip.

In addition, although in the above-noted embodiments NiFe was used as the buffer film 9, it is also possible to use Ni—Co or other magnetic materials. Also, while cobalt films 11 were used in the above-noted embodiments as magnetic films, it is possible to use other magnetic materials, such as Fe, Ni—Fe, Ni—Co, or Ni—Fe—Co. In the same manner, while copper films 10 were used as the non-magnetic films 10 in the above noted embodiments, it is possible to use other materials, such as Cr, Ag or Pt. Whereas in the 2nd embodiment a SiO2 film was used as the insulating film, it is also possible to use an SiN, an $Al_2O_3$, or a polyimide type insulating film. In addition, whereas in the above-noted embodiments a nitride was used as the surface-protection film, it is also possible to use an $SiO_2$, an $Al_2O_3$, or a polyimide type insulating film.

Also, the moving object having alternately differing magnetic poles is not limited to a rotating body; it can also be an element that moves in parallel with respect to the magneto-electric conversion devices.

In essence, as indicated above, the method or manufacturing a magneto-electric conversion device of the 2nd embodiment of the present invention comprises, for example, a 1st step which forms the buffer film 9 on the top of the substrate 6, a 2nd step which forms a non-magnetic thin film 10 on this buffer film 9, a 3rd step which alternately deposits a magnetic thin film 11 on the non-magnetic thin film 10, a 4th step which repeats the 2nd and 3rd steps a number of times to form a layer of above-noted non-magnetic thin films 10 and magnetic thin films 11, a 5th step which forms an insulating film 13 on the surface of the above-noted layer, and a 6th step which performs patterning of the required pattern on the laminate which has the above-noted insulating film 13.

In addition, in the 2nd embodiment of the present invention, it is desirable to have a further 7th step which forms a surface-protection film onto the layer which has the above-noted patterned insulating film 13.

As is clear from the above-noted 2nd embodiment, in the method of manufacturing a magneto-electric conversion device of the present invention, it is possible that the above noted substrate 6 is a single-crystal silicon substrate onto the surface of which is formed the insulating film 7. In addition, it is possible in the method of manufacturing a magneto-electric conversion device 5 of the present invention to have a step in which the buffer film 9 is formed beforehand on the above-noted substrate.

A simple explanation of the configuration of a moving object displacement detector using the magneto-electric conversion device manufactured by the method of manufacturing a magneto-electric conversion device of the present invention is as follows.

In one example of a moving object displacement detector of the present invention, the basic configuration is such that the above-noted magneto-electric conversion device manufactured by the method of manufacturing a magneto-electric conversion device of the present invention is positioned so as to be opposite to and at a distance from a moving object, which has a surface which is alternately magnetized with differing magnetic poles. It is desirable to have this moving object be a rotating body. In the case in which a magnetic flux is applied vertically to the above-noted magneto-electric conversion device, it is desirable that the value of magnetic resistance of the above noted magneto-electric conversion device be at least 20% lower than the value of magnetic resistance of the above noted magneto-electric conversion device for the case in which horizontal magnetic flux is applied to the above-noted magneto-electric conversion device.

As described above, the present invention provides a method of manufacturing a magneto-electric conversion device which has a large rate of change of magnetic resistance and also is easy to position with respect to the magnetized surface, and further provides a moving object displacement detector using a magneto-electric conversion device manufactured by this method.

We claim:

1. A method of manufacturing a magneto-electric conversion device comprising:

providing a substrate;

alternatively depositing a magnetic thin film and a non-magnetic thin film on said substrate;

depositing an insulating film on said thin films; and patterning said insulating film.

2. A method of manufacturing a magneto-electric conversion device according to claim 1, further comprising a step of providing a surface-protection film on said patterned insulated film.

3. A method of manufacturing a magneto-electric conversion device according to claim 1, wherein said thin films define a magnetoresistive element.

4. A method of manufacturing a magneto-electric conversion device according to claim 1, wherein said substrate is a single-crystal silicon substrate add wherein an insulating film is provided on a surface thereof.

5. A method of manufacturing a magneto-electric conversion device according to claim 1, further comprising a step of providing a buffer film on a surface of said substrate prior to depositing said thin films thereon.

6. A method of manufacturing a magneto-electric conversion device according to claim 5, wherein said buffer film consists of a soft-magnetic material.

7. A method of manufacturing a magneto-electric conversion device according to claim 1, wherein said step of alternately depositing said thin films is repeated a number of times.

8. A method of manufacturing a magneto-electric conversion device according to claim 1, wherein said magnetic thin film is a cobalt film, and said non-magnetic thin film is a copper film.

9. A method of manufacturing a magneto-electric conversion device according to claim 5, wherein said buffer film is a soft-magnetic Ni—Fe material.

10. A method of manufacturing a magneto-electric conversion device comprising:

provinding a substrate;

forming a buffer film on said substrate forming a non-magnetic thin film on said buffer film;

forming a magnetic thin film on said non-magnetic thin film;

repeating said steps of forming said magnetic thin film and said non-magnetic thin film a number of times to form a layer on said substrates; forming an insulating film on said layer; and patterning said insulating film.

11. A method of manufacturing a magneto-electric conversion device according to claim 10, further comprising a step of providing a surface-protection film on said layer.

12. A moving object displacement detector comprising:

a magnetized surface having alternating magnetic poles providing on the moving object;

a magneto-electric conversion device positioned with respect to said moving object such that magnetic flux generated by said magnetized surface are detected by said conversion device which comprises:

a substrate, alternating deposits of a magnetic thin film and a non-magnetic thin film disposed on said substrate, and an insulating film disposed on said thin films.

13. A moving object displacement detector according to claim 12, wherein said moving object is a rotating body.

14. A moving object displacement detector according to claim 12, wherein a value of a magnetic resistance of said magneto-electric conversion device if said magnetic flux is applied vertically to said magneto-electric conversion device is at least 20% smaller than a case wherein a horizontal magnetic flux is applied to said magneto-electric conversion device.

* * * * *